United States Patent
Iioka et al.

(10) Patent No.: US 7,583,536 B2
(45) Date of Patent: Sep. 1, 2009

(54) CHARGE LOSS RESTORATION METHOD AND SEMICONDUCTOR MEMORY DEVICE

(75) Inventors: Osamu Iioka, Kawasaki (JP); Naoto Emi, Kawasaki (JP)

(73) Assignee: Fujitsu Microelectronics Ltd., Tokyo (JP)

( * ) Notice: Subject to any disclaimer, the term of this patent is extended or adjusted under 35 U.S.C. 154(b) by 62 days.

(21) Appl. No.: 12/003,985

(22) Filed: Jan. 4, 2008

(65) Prior Publication Data

US 2008/0181002 A1 Jul. 31, 2008

(30) Foreign Application Priority Data

Jan. 31, 2007 (JP) ............................... 2007-021478

(51) Int. Cl.
*G11C 11/34* (2006.01)
(52) U.S. Cl. ............................... 365/185.2; 365/185.24
(58) Field of Classification Search ............. 365/185.2, 365/185.24, 185.22
See application file for complete search history.

(56) References Cited

U.S. PATENT DOCUMENTS

| 5,912,836 | A  | * | 6/1999 | Liu et al. ............... 365/185.01 |
| 6,813,752 | B1 | * | 11/2004 | Hsia et al. ...................... 716/4 |
| 7,489,558 | B2 | * | 2/2009 | Choi et al. ............. 365/185.24 |
| 2008/0130362 | A1 | * | 6/2008 | Sporea et al. ............ 365/185.2 |

FOREIGN PATENT DOCUMENTS

JP 2002-074999 3/2002

* cited by examiner

*Primary Examiner*—Anh Phung
(74) *Attorney, Agent, or Firm*—Arent Fox LLP

(57) ABSTRACT

A charge loss restoration method detects a memory cell having a tendency of a charge loss within a memory cell array of an electrically writable and erasable nonvolatile semiconductor memory device, using a charge loss detecting reference cell having a threshold value set between a threshold value of a read reference cell and a threshold value of a write verify reference cell, where the threshold value of the write verify reference cell is higher than the threshold value of the read reference cell, and restores the memory cell having the tendency of the charge loss by making an additional write thereto.

17 Claims, 14 Drawing Sheets

FIG.6

| No. | READ DATA OUTPUT | CHARGE LOSS DETECTION RESULT OUTPUT | READ RESULT | CHARGE LOSS DETECTION RESULT | THRESHOLD VALUE REGION |
|---|---|---|---|---|---|
| 1 | 0 | 0 | 0(NORMAL DATA) | NO PROBLEM | A |
| 2 | 0 | 1 | 0(NORMAL DATA) | PROBLEM EXISTS | B |
| 3 | 1 | 1 | 1(ABNORMAL DATA) | PROBLEM EXISTS | C |

CHARGE LOSS RESTORATION METHOD AND SEMICONDUCTOR MEMORY DEVICE

BACKGROUND OF THE INVENTION

1. Field of the Invention

The present invention generally relates to charge loss restoration methods and semiconductor memory devices, and more particularly to a charge loss restoration method for detecting and restoring a charge loss of a memory cell, and to a semiconductor memory device employing such a charge loss restoration method.

2. Description of the Related Art

With respect to a nonvolatile semiconductor memory device such as a flash memory having a structure that stores data by accumulating a charge at a floating gate, an accelerated life test is carried out before the nonvolatile semiconductor memory device is forwarded so to make a screening or a redundancy substitution of memory cells indicating a charge loss. The accelerated life test may be an electric field accelerated life test that applies a high voltage to a word line or a bit line or, a high temperature accelerated life test that applying a high temperature to the nonvolatile semiconductor memory device by baking. In other words, the electric field accelerated life test or the high temperature accelerated life test creates a condition approximating an operation guarantee period of the nonvolatile semiconductor memory device, for example, and the memory cell indicating a charge loss outside a tolerable range is substituted by a redundant memory cell. However, after the nonvolatile semiconductor memory device is forwarded and assembled into a system, it is impossible to remedy the charge loss that occurs in the nonvolatile semiconductor memory device that has been assembled into the system.

FIG. 1 is a diagram showing a relationship of threshold values of a written memory cell and an erased memory cell and a read reference cell in a conventional nonvolatile semiconductor memory device. In FIG. 1, the ordinate indicates a drain-source current Ids of a transistor forming each memory cell in arbitrary units, and the abscissa indicates a gate-source voltage Vgs of the transistor forming each memory cell in arbitrary units. In addition, FIG. 2 is a diagram showing distributions of the written cell and the erased cell in the conventional nonvolatile semiconductor memory device. In FIG. 2, the ordinate indicates a number of memory cells in arbitrary units, and the abscissa indicates a threshold value in arbitrary units. As indicated by an arrow in FIG. 1, the characteristics of the memory cells are such that the written cell makes a transition towards the lower threshold value (charge loss) as the memory cells deteriorate with time.

The applicants are aware of a Japanese Laid-Open Patent Application No. 2002-74999 which proposes a nonvolatile semiconductor memory device having a circuit for detecting the charge loss and the charge gain.

Normally, the write is made with respect to the memory cell to a threshold value that does not result in an erroneous read judgement even when the memory cell deteriorates with time, and no problem occurs in the case of a normal memory cell. In addition, in the case of a memory cell that results in the erroneous read judgement, it is possible to substitute the memory cell by a suitable redundant memory cell prior to forwarding the nonvolatile semiconductor memory device, because the memory cell that results in the erroneous read judgement can be screened by the electric field acceleration test or the high temperature acceleration test. However, there exists a memory cell that cannot be screened by the electric field acceleration test or the high temperature acceleration test, but for some reason exhibits a characteristic abnormality indicated by X1 in FIG. 2 after the nonvolatile semiconductor memory device is forwarded. In the memory cell which exhibits such a characteristic abnormality, the threshold values change to an erroneous read judgement region by moving outside the main distributions of the written cell, and although this memory cell is defective, this defective memory cell cannot be substituted by a redundant memory cell after the nonvolatile semiconductor memory device is forwarded.

SUMMARY OF THE INVENTION

According to one aspect of the present invention, a charge loss restoration method includes a detection step detecting a memory cell having a tendency of a charge loss within a memory cell array of an electrically writable and erasable nonvolatile semiconductor memory device, using a charge loss detecting reference cell having a threshold value set between a threshold value of a read reference cell and a threshold value of a write verify reference cell, where the threshold value of the write verify reference cell is higher than the threshold value of the read reference cell, and a restoration step restoring the memory cell having the tendency of the charge loss by making an additional write thereto. According to this aspect of the present invention, it is possible to detect and restore the charge loss even in a state where the nonvolatile semiconductor memory device is assembled into a system.

According to another aspect of the present invention, an electrically writable and erasable non-volatile semiconductor memory device includes a memory cell array having a plurality of memory cells, a charge loss detecting reference cell having a threshold value set between a threshold value of a read reference cell and a threshold value of a write verify reference cell, where the threshold value of the write verify reference cell is higher than the threshold value of the read reference cell, a detection circuit configured to detect a memory cell having a tendency of a charge loss within the memory cell array using the read reference cell and the charge loss detecting reference cell, and a restoration circuit configured to restore the memory cell that is detected by the detection circuit as having the tendency of the charge loss, by making an additional write thereto. According to this aspect of the present invention, it is possible to detect and restore the charge loss even in a state where the nonvolatile semiconductor memory device is assembled into a system.

BRIEF DESCRIPTION OF THE DRAWINGS

FIG. 6 is a diagram showing a relationship of outputs of sense amplifiers for reading and charge loss detection;

DESCRIPTION OF THE PREFERRED EMBODIMENTS

According to one embodiment of the present invention, a memory cell having a tendency (or indication) of a charge loss within a memory cell array of an electrically writable and erasable nonvolatile semiconductor memory device is detected, using a charge loss detecting reference cell having a threshold value set between a threshold value of a read reference cell and a threshold value of a write verify reference cell, where the threshold value of the write verify reference cell is higher than the threshold value of the read reference cell. The memory cell that is detected as having the tendency of the charge loss is restored by making an additional write thereto.

The memory cell having the tendency of the charge loss may be detected when simultaneously reading data from memory cells at a plurality of addresses. In addition, the additional write to the memory cell that is detected as having the tendency of the charge loss may be made simultaneously as when the data read simultaneously are serially output from the memory cell array.

The detection of the memory cell having the tendency of the charge loss may be carried out with respect to a region other than an erase target of a sector erase. Further, the charge loss may be restored by writing the data that is obtained when detecting the charge loss with respect to an internal address that is generated when detecting the charge loss.

According to one embodiment of the present invention, it is possible to detect and restore the charge loss even in a state where the nonvolatile semiconductor memory device is assembled into a system.

Next, a description will be given of embodiments of the charge loss restoration method and the semiconductor memory device according to the present invention, by referring to FIG. 3 and the subsequent figures. In the following embodiments, it is assumed for the sake of convenience that the present invention is applied to an electrically writable (or programmable) and erasable nonvolatile semiconductor memory device. The nonvolatile semiconductor memory device is characterized by having a charge loss detecting reference cell for charge loss detection, in addition to having a read reference cell for reading, a write verify reference cell for write verify. Of course, the nonvolatile semiconductor memory device may further have an erase verify reference cell for erase verify.

First Embodiment

Figure 1:
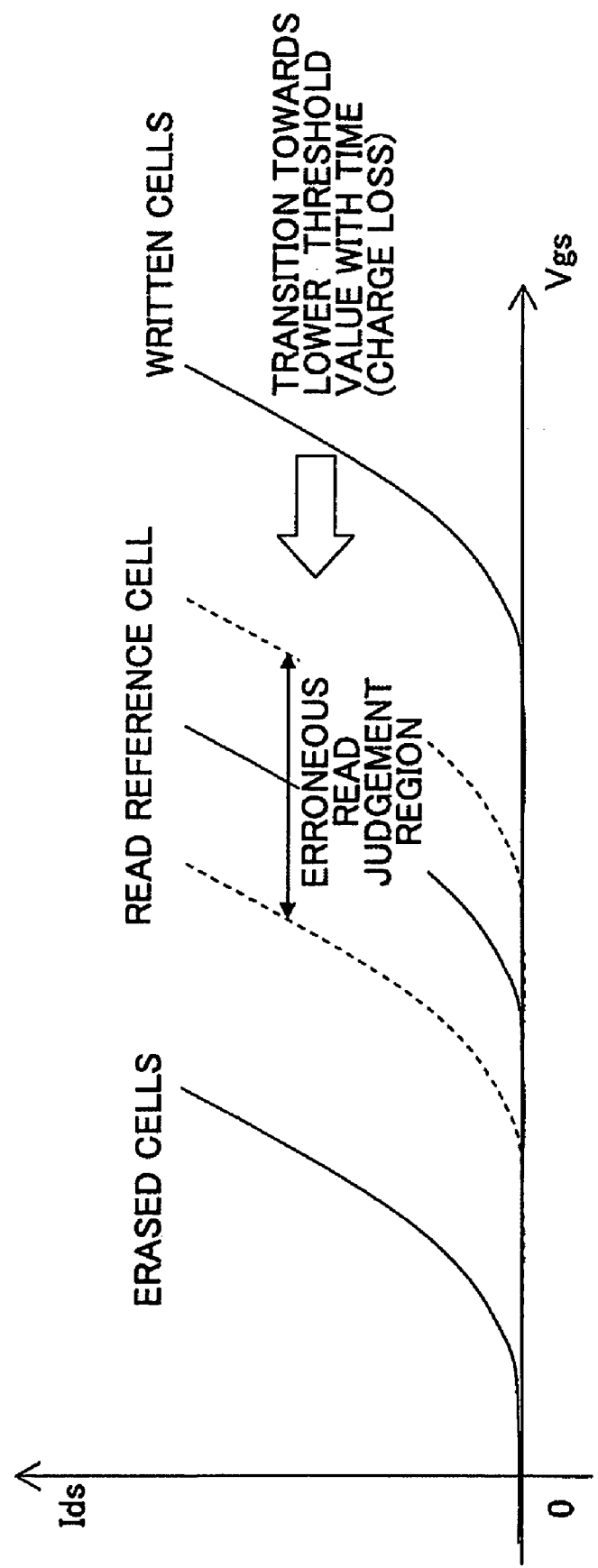
FIG. 1 is a diagram showing a relationship of threshold values of a written memory cell and an erased memory cell and a read reference cell in a conventional nonvolatile semiconductor memory device.
Figure 2:
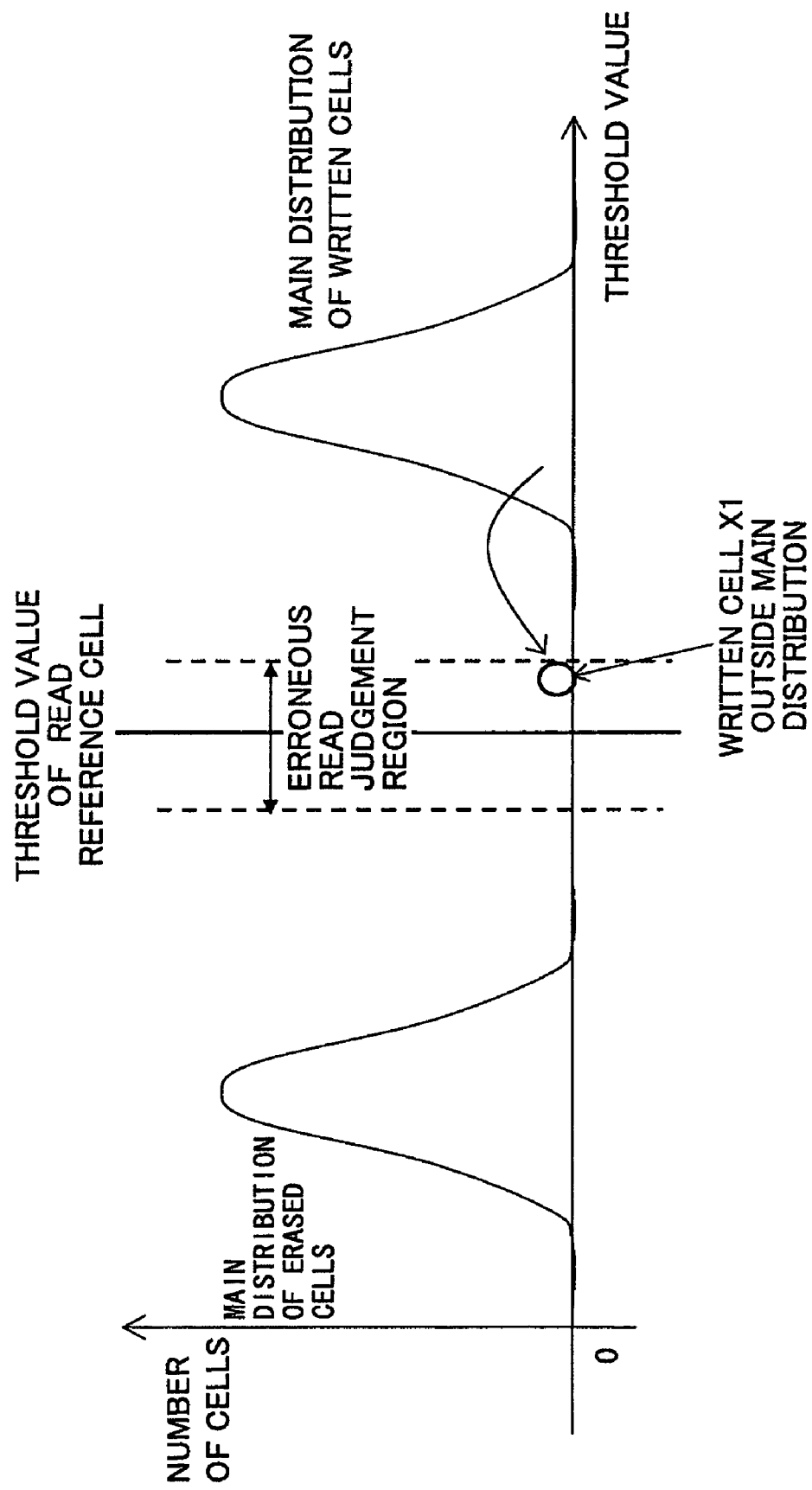
FIG. 2 is a diagram showing a distribution of threshold values of written cells and erased cells in the conventional nonvolatile semiconductor memory device.
Figure 3:
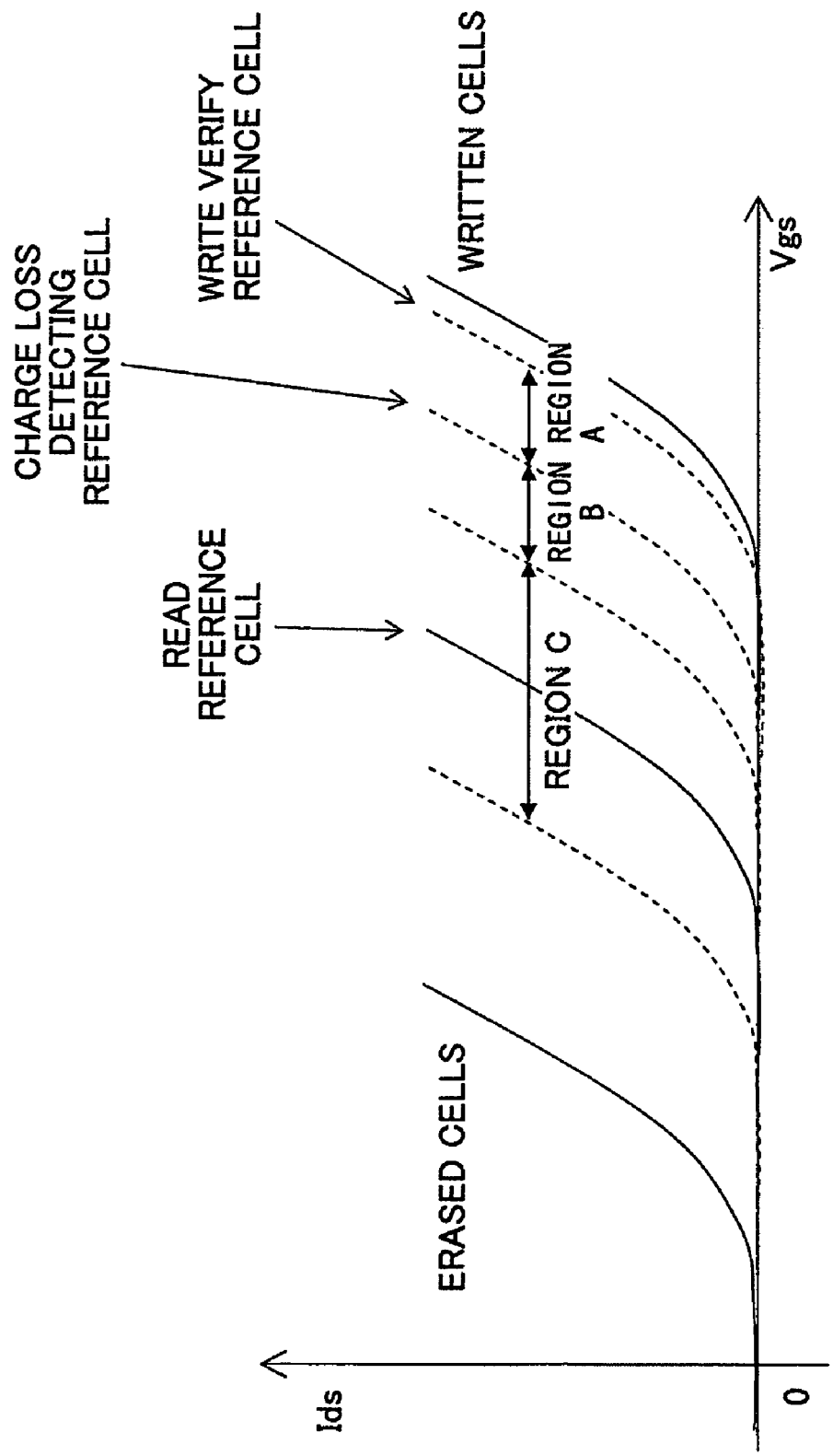
FIG. 3 is a diagram showing a relationship of threshold values of three kinds of reference cells.

FIG. 3 is a diagram showing a relationship of threshold values of three kinds of reference cells in the nonvolatile semiconductor memory device. In FIG. 3, the ordinate indicates a drain-source current (Ids) of a transistor forming each memory cell in arbitrary units, and the abscissa indicates a gate-source voltage (Vgs) of the transistor forming each memory cell in arbitrary units. The charge loss detecting reference cell is used to detect the tendency (or indication) of the charge loss, by setting a threshold value of the charge loss detecting reference cell to a value between a threshold value of the read reference cell and a threshold value of the write verify reference cell and so that a read judgement can be made in a normal manner.

Figure 4:
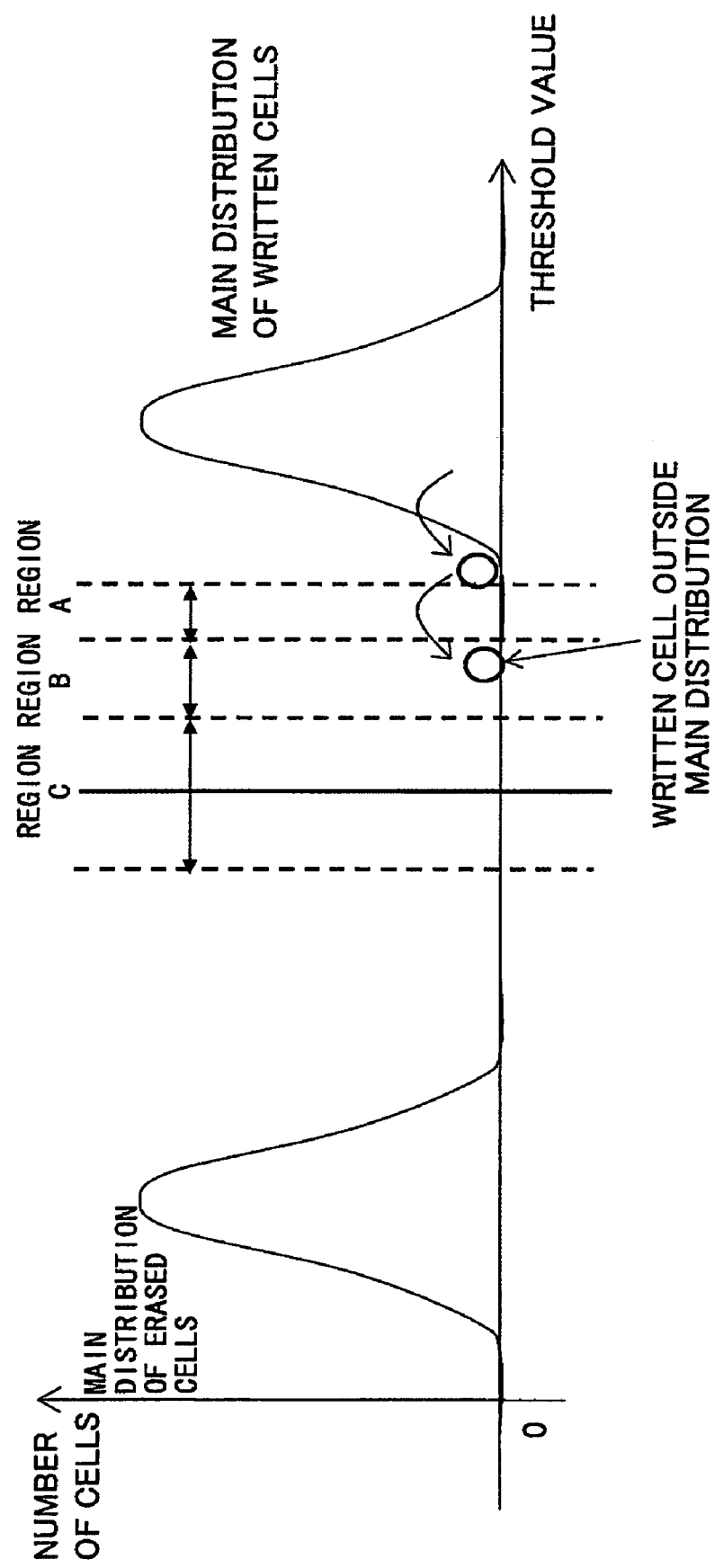
FIG. 4 is a diagram showing the threshold values of the three kinds of reference cells shown in FIG. 3 in an overlapping manner on the distribution of the threshold values of the memory cells.

In FIG. 3 and FIG. 4 which will be described later, A indicates a safe read judgement region in which the read data from the memory cell can be judged correctly, B indicates a dangerous read judgement region in which the read data from the memory cell can be judged correctly in the present state but there is a possibility of being judged erroneously in the future, and C indicates an erroneous read judgement region in which the read data from the memory cell is judged erroneously.

FIG. 4 is a diagram showing the threshold values of the three kinds of reference cells shown in FIG. 3 in an overlapping manner on the distribution of the threshold values of the memory cells. In FIG. 4, the ordinate indicates the number of memory cells in arbitrary unit, and the abscissa indicates the threshold value in arbitrary units. In the memory cell which exhibits a characteristic abnormality, the threshold value gradually changes towards the erroneous read judgement region C with aging and moves outside the main distribution of the threshold values of the memory cells. Hence, if the abnormal memory cell can be detected and restored before the threshold value enter the erroneous read judgement region C, it becomes possible to prevent an erroneous read judgement.

Figure 5:
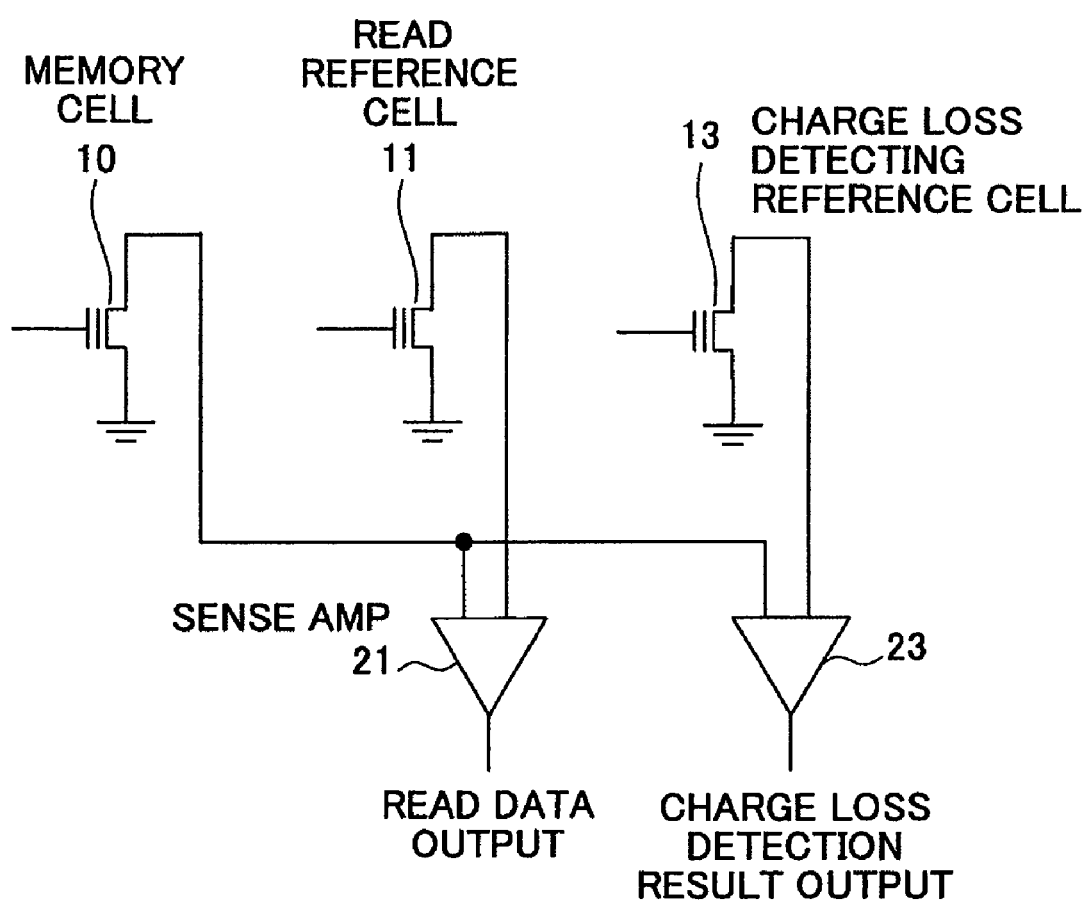
FIG. 5 is a circuit diagram showing an important part of a reference cell part and a sense amplifier part for explaining a charge loss detection method in a first embodiment of the present invention.

FIG. 5 is a circuit diagram showing an important part of a reference cell part and a sense amplifier part for explaining a charge loss detection method for the nonvolatile semiconductor memory device in this first embodiment. The write verify reference cell and the erase verify reference cell within the reference cell part are used at the time of the write and the erase, and are not used at the time of the read. For this reason, the illustration of the write verify reference cell and the erase verify reference cell is omitted in FIG. 5, but the write verify reference cell and the erase verify reference cell are basically connected similarly to the read reference cell with respect to the memory cells. One input of a 2-input sense amplifier 21 for reading and one input of a 2-input sense amplifier 23 for charge loss detection are connected to a memory cell 10. The other input of the 2-input sense amplifier 21 is connected to a read reference cell 11 that is provided exclusively therefor. The other input of the 2-input sense amplifier 23 is connected to a charge loss detecting reference cell 13 that is provided exclusively therefor. When making a read data judgement of the memory cell 10, it is possible to detect the charge loss simultaneously as the reading, without using extra time, by simultaneously operating a charge loss judging circuit.

FIG. 6 is a diagram showing a relationship of outputs of the sense amplifiers for reading and charge loss detection in the nonvolatile semiconductor memory device. In FIG. 6, a read data output is obtained from the sense amplifier 21 shown in FIG. 5, a charge loss detection (or comparison) result output is obtained from the sense amplifier 23 shown in FIG. 5. If a case where the threshold value of the memory cell 10 is higher than the threshold value of the reference cell is defined as data "0" and a case where the threshold value of the memory cell 10 is lower than the threshold value of the reference cell is defined as data "1", it is judged that there is a tendency (or indication) of the charge loss for the data output combination designated by a case No. 2. Accordingly, in this first embodiment, in the case No. 2 shown in FIG. 6, the memory cell that has not been subjected to the redundancy substitution before the nonvolatile semiconductor memory device is forwarded is subjected to the redundancy substitution and substituted by a redundant memory cell. Hence, even in a state after the nonvolatile semiconductor memory device is forwarded and assembled into a system, it is possible to detect the tendency (or indication) of the charge loss and make the redundancy substitution before the erroneous read judgement occurs.

Next, a description will be given of the procedures for detecting and restoring the tendency of the charge loss. In this first embodiment, the tendency of the charge loss is detected and restored, simultaneously as when a read is carried out in the nonvolatile semiconductor memory device that has a serial data output function such as a page mode and a burst mode.

Figure 7:
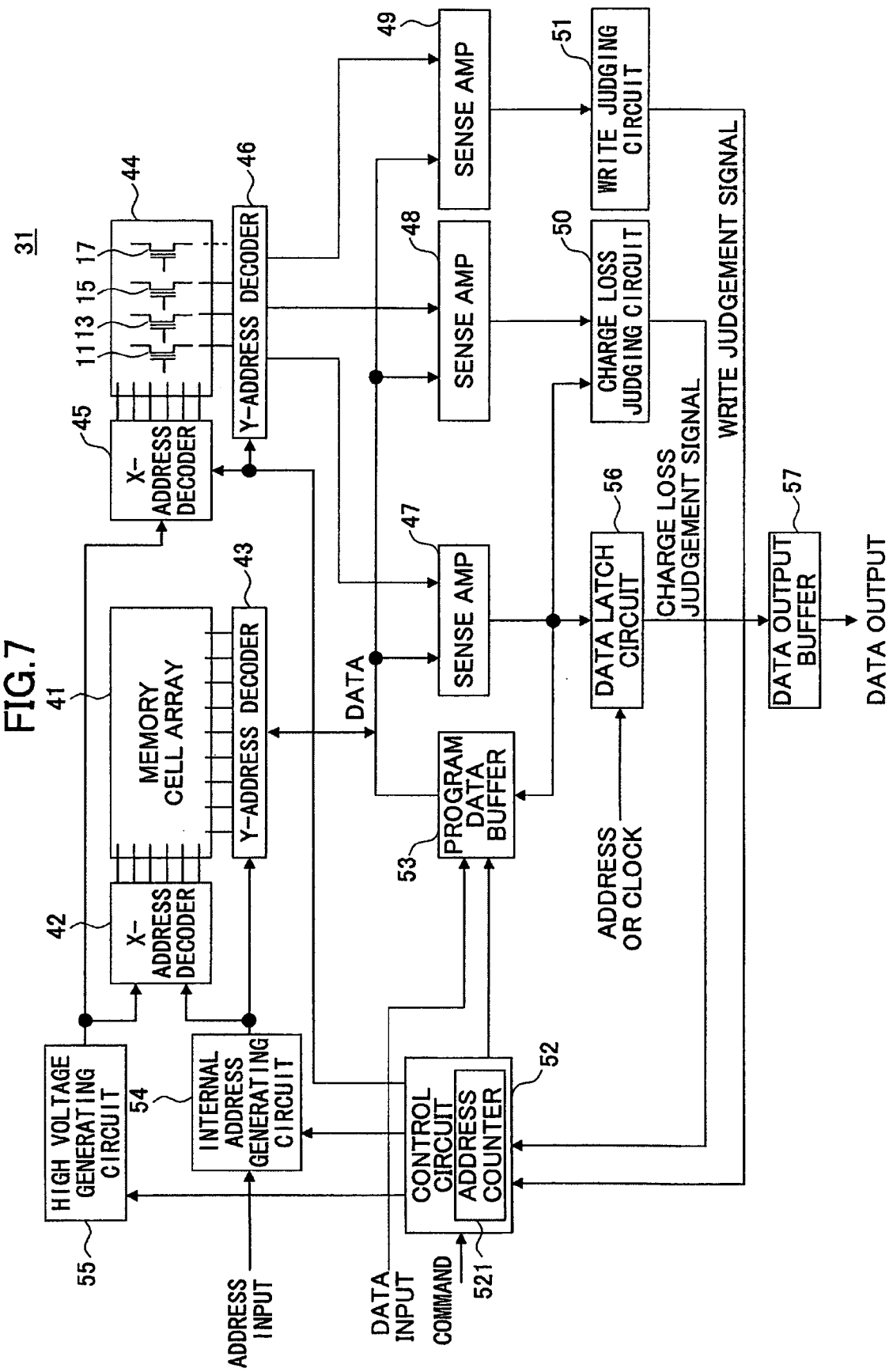
FIG. 7 is a system block diagram showing an important part of the first embodiment.

FIG. 7 is a system block diagram showing an important part of this first embodiment. A nonvolatile semiconductor memory device 31 includes a memory cell array 41, an X-address decoder 42, a Y-address decoder 43, a reference memory cell array 44, an X-address decoder 45, a Y-address decoder 46, a normal sense amplifier 47, a sense amplifier 48 for charge loss detection, a sense amplifier 49 for write verify, a charge loss judging circuit 50, a write judging circuit 51, a control circuit 52, a program data buffer 53, an internal address generating circuit 54, a high voltage generating circuit 55, a data latch circuit 56, and a data output buffer 57 that are connected as shown in FIG. 7.

The reference memory cell array 44 includes erase verify reference cells 15 and write verify reference cells 17, in addition to the read reference cells 11 and the charge loss detecting reference cells 13 shown in FIG. 5. The normal sense amplifier 47 and the sense amplifier 48 for charge loss detection respectively correspond to the sense amplifiers 21 and 23 shown in FIG. 5. The high voltage generating circuit 55 supplies a relatively high voltage to the gates of the memory cells within the memory cell arrays 41 and 44 via the decoders 42 and 45, under the control of the control circuit 52, at the time of the write including the write verify, the erase including the erase verify, the read, and the charge loss detection. The erase verify itself using the erase verify reference cell 15 and the write verify itself using the write verify reference cell 17 may be carried out by a known method.

The memory cells within the memory cell array 41 and the memory cells within the reference memory cell array 44 are desirably made on the same substrate using the same semiconductor production processes.

In a case where the nonvolatile semiconductor memory device 31 has a structure that does not carry out the write verify, the write verify memory cells 17 within the reference memory cell array 44, the sense amplifier 49 for write verify, and the write judging circuit 51 may be omitted.

The sense amplifiers 47 and 48 and the charge loss judging circuit form a detection circuit (or detection means) for detecting a memory cell that is within the memory cell array 41 and has the tendency of a charge loss, using the read reference cell 11 and the charge loss detecting reference cell 13. In addition, the control circuit 52 and the program data buffer 53 for a restoration circuit (or restoration means) for restoring the memory cell that is detected by the detection circuit as having the tendency of the charge loss, by making an additional write that writes a data to the memory cell detected by the detection circuit. Furthermore, the sense amplifier 49, the write judging circuit 51 and the control circuit 52 form a verify circuit (or verify means) for making a write verify using the write verify reference cell 17 after making the additional write.

Figure 8:
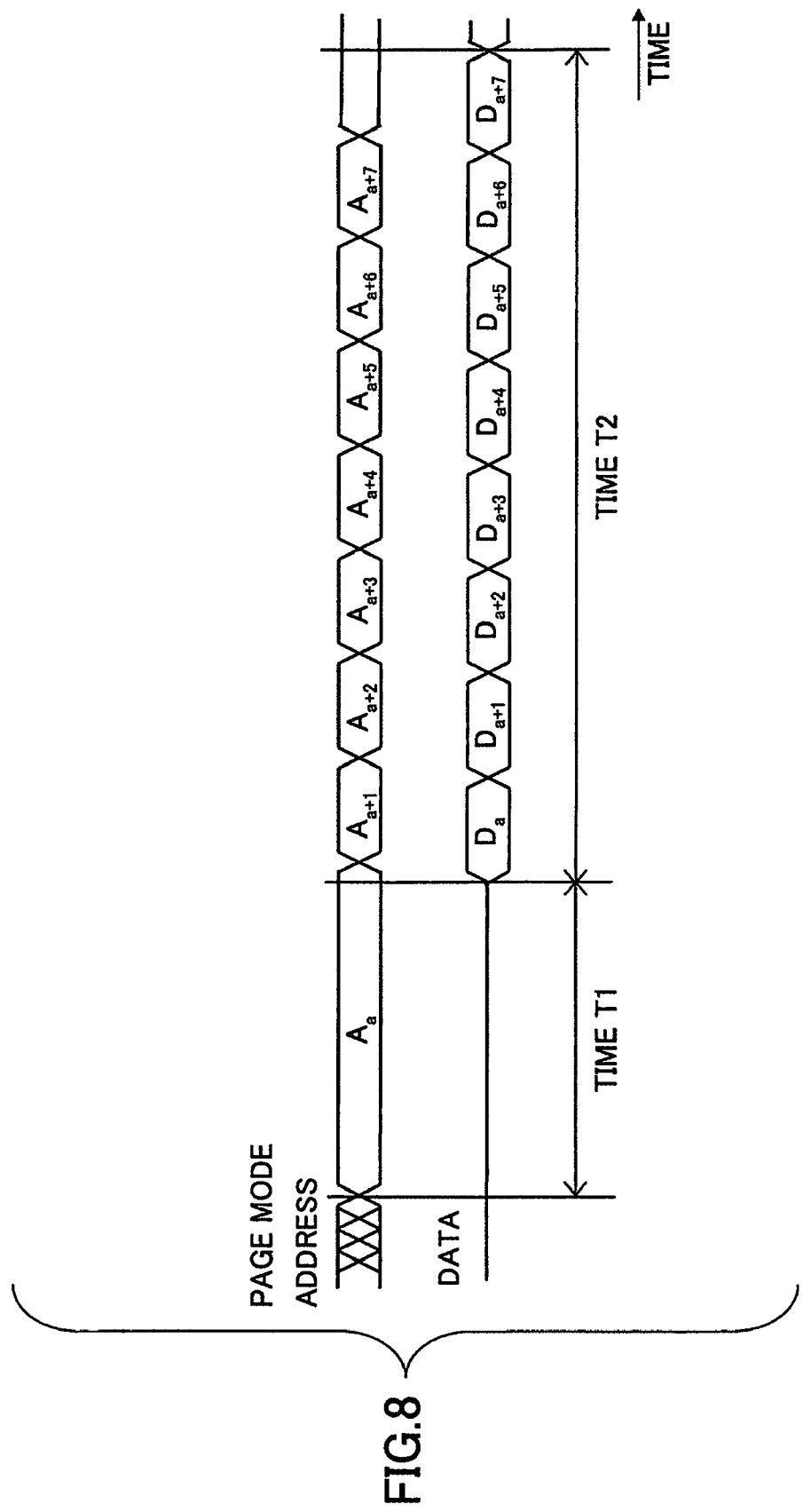
FIG. 8 is a timing chart showing a relationship of an address input and a data output in a page mode.

FIG. 8 is a timing chart showing a relationship of an address input and a data output in a page mode, which is one method of simultaneously reading a plurality of addresses within the nonvolatile semiconductor memory device 31 and serially outputting the data one address at a time. When an initial address $A_a$ that becomes the starting point of the read is input to the decoders 42 and 43 via the internal address generating circuit 54, a plurality of consecutive addresses (eight addresses from the address $A_a$ to an address $A_{a+7}$ in FIG. 8) are decoded by the decoders 42 and 43 within a time T1, and the data are simultaneously read from the corresponding memory cells within the memory cell array 41. The simultaneously read data are held in the data latch circuit 56 via the normal sense amplifier 47. Thereafter, during a time T2, the read data are output via the data output buffer 57 one address at a time in synchronism with the address. Because no read access is made to the memory cells within the memory cell array 41 during the time T2, if a memory cell is detected as having the tendency of the charge loss, it is possible to restore this memory cell by making the additional write or the like to this memory cell.

Figure 9:
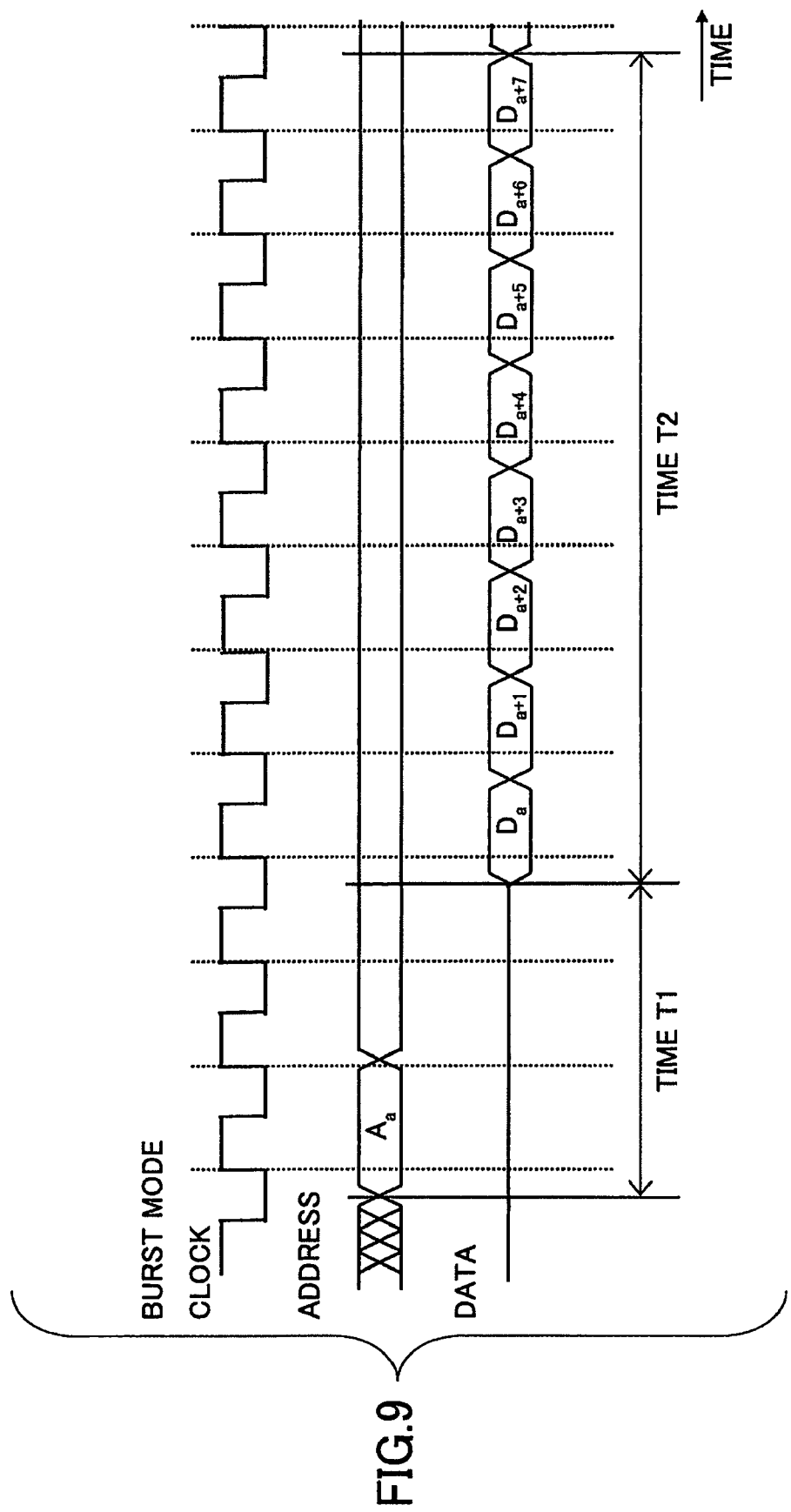
FIG. 9 is a timing chart showing a relationship of the address input and the data output in a burst mode.

FIG. 9 is a timing chart showing a relationship of the address input and the data output in a burst mode, which is one method of simultaneously reading a plurality of addresses within the nonvolatile semiconductor memory device 31 and serially outputting the data one address at a time. When an initial address $A_a$ that becomes the starting point of the read is input to the decoders 42 and 43 via the internal address generating circuit 54, a plurality of consecutive addresses (eight addresses from the address $A_a$ to an address $A_{a+7}$ in FIG. 9) are decoded by the decoders 42 and 43 within a time T1, and the data are simultaneously read from the corresponding memory cells within the memory cell array 41. The simultaneously read data are held in the data latch circuit 56 via the normal sense amplifier 47. Thereafter, during a time T2, the read data are output via the data output buffer 57 one address at a time in synchronism with a clock. Because no read access is made to the memory cells within the memory cell array 41 during the time T2, if a memory cell is detected as having the tendency of the charge loss, it is possible to restore this memory cell by making the additional write or the like to this memory cell.

The nonvolatile semiconductor memory device 31 operates as follows during the time T1. After the initial address is input, the memory cells at the plurality of addresses within the memory cell array 41 are selected, and the address of the read reference cell 11 that is output from the control circuit 52 is decoded by the decoders 45 and 46 so that the read reference cell 11 within the reference memory cell array 44 is selected. The data of the memory cells at the plurality of addresses within the memory cell array 41 are compared with the data of the read reference cell 11 within the reference memory cell array 44 in the normal sense amplifier 47, and the data values at the plurality of addresses are judged simultaneously. At the same time, the address of the charge loss detecting reference cell 13 that is output from the control circuit 52 is decoded by the decoders 45 and 46 so that the charge loss detecting reference cell 13 within the reference memory cell array 44 is selected. The data of the memory cells at the plurality of addresses within the memory cell array 41 are compared with the data of the charge loss detecting reference cell 13 within the reference memory cell array 44 in the sense amplifier 48, and the tendencies of the charge loss at the plurality of addresses are judged simultaneously. In this embodiment, the number of both the normal sense amplifiers 47 for the read and the sense amplifiers 48 for the charge loss detection corresponds to the number of addresses from which the data are read simultaneously from the memory cell array 41.

The data that are read simultaneously from the memory cell array 41 are held in the data latch circuit 56 via the normal sense amplifier 47. On the other hand, the data that is read for the charge loss detection is supplied to the charge loss judging circuit 50 via the sense amplifier 48, and is compared with the read data that are output from the normal sense amplifier 47 in the charge loss judging circuit 50 so as to judge whether or not the charge loss is generated.

The nonvolatile semiconductor memory device 31 operates as follows during the time T2. The data that are held in the data latch circuit 65 are output via the data output buffer 57, one address at a time, in synchronism with the address in the case of the page mode and in synchronism with the clock in the case of the burst mode. At the same time, if the charge loss judging circuit 50 judges that the charge loss of a memory cell is generated, the control circuit 52 makes a write with respect to the memory cell that is within the memory cell array 41 and is judged as having the charge loss. The address of the memory cell that is judged (or detected) as having the charge loss is input from the control circuit 52 to the decoders 42 and 43 via the internal address generating circuit 54. In addition, the data that is written to the memory cell that is detected as having the charge loss may be re-input to the memory cell array 41 via the program data buffer 53 from outside the nonvolatile semiconductor memory device 31 or, input to the memory cell array 41 via the program data buffer 53 under the control of the control circuit 52 or, the output data of the normal sense amplifier 47 may be input to the memory cell array 41 via the program data buffer 53 under the control of the control circuit 52. Since the charge loss is detected in a stage where the amount of charge loss is small, it is possible to employ a circuit structure that does not carry out the write verify after the additional write. In this case, a step S6 shown in FIG. 10 which will be described later may be omitted.

Figure 10:
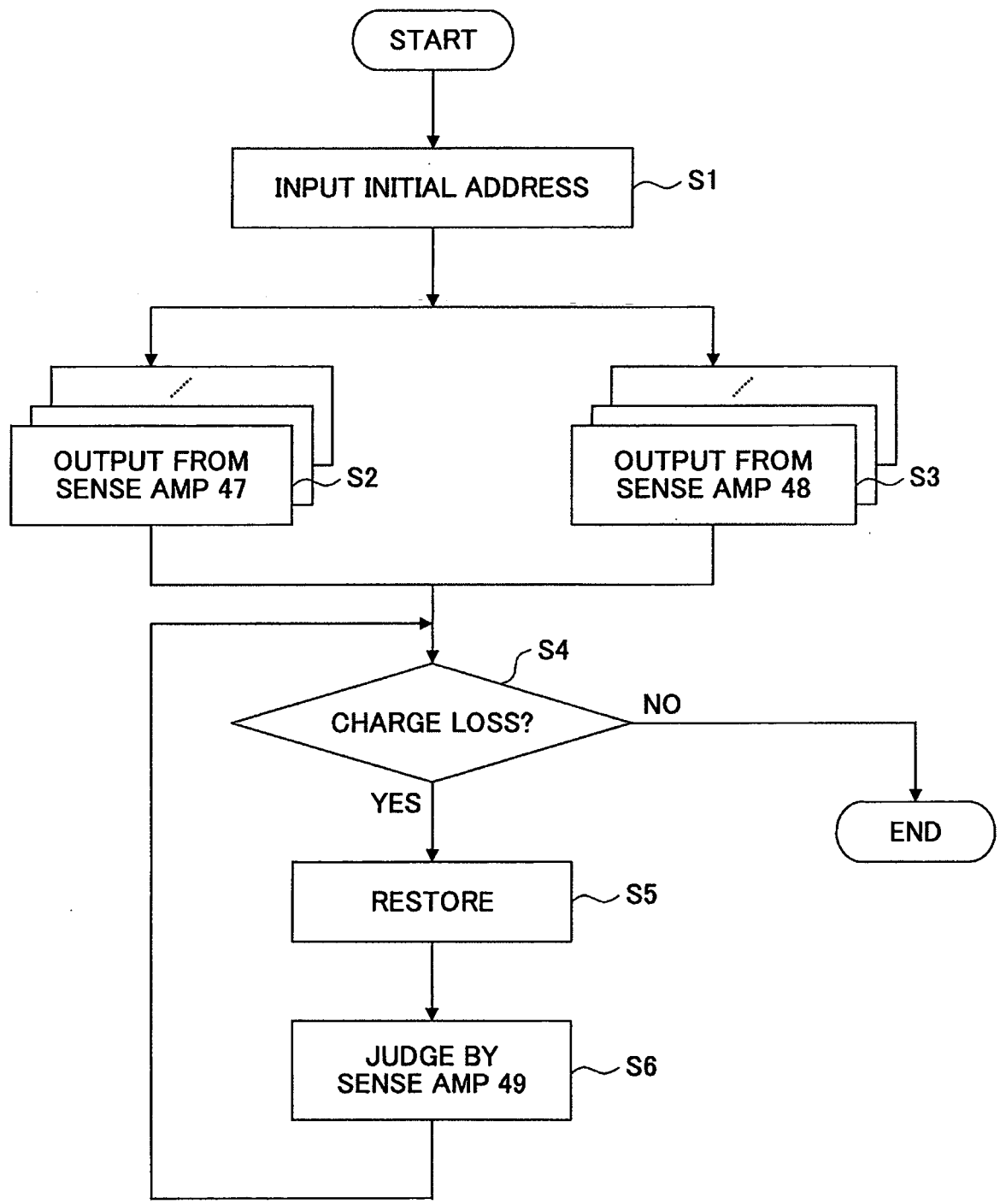
FIG. 10 is a flow chart for explaining a charge loss judging and restoration process of the first embodiment.

FIG. 10 is a flow chart for explaining a charge loss judging and restoration process of the first embodiment. In a step S1 shown in FIG. 10, the initial address is input to the decoders 42 and 43 via the internal address generating circuit 54. Steps S2 and S3 are carried out simultaneously. In the step S2, the output data, amounting to the number of addresses from which the data are simultaneously read, and the data values of which are judged by the normal sense amplifier 47, are output to the charge loss judging circuit 50. In the step S3, the output data, amounting to the number of addresses from which the data are simultaneously read, and the charge loss tendencies of which are judged by the sense amplifier 48, are output to the charge loss judging circuit 50. In a step S4, the charge loss judging circuit 50 judges whether or not the charge loss is generated in the memory cells within the memory cell array 41 from which the read is made. If the judgement result in the step S4 is YES, a step S5 makes the additional write with respect to the memory cell that is detected as having the charge loss and restores this memory cell. After the step S5, a step S6 makes a write verify using the sense amplifier 49 after making the additional write, and the process returns to the step S4. On the other hand, the process ends if the judgement result in the step S4 is NO. If the judgement result in the step S4 is NO, it is possible to judge whether or not the address is a last address, and to end the process if the address is the last address.

As described above, the charge loss is detected in a stage where the amount of charge loss is small, and it is possible to employ a circuit structure that does not carry out the write verify after the additional write. In this case, the step S6 may be omitted, and the process after the step S5 may return to the step S4.

Next, a description will be given of a case where the write verify is made after making the additional write with respect to the memory cell that is within the memory cell array 41 and is detected as having the charge loss in this embodiment. After making the additional write with respect to the memory cell that is detected as having the charge loss, the write verify is made using the write verify reference cell 17 within the reference memory cell array 44, and a process of making the additional write again under the control of the control circuit 52 in response to a write judgement signal that is output from the write judging circuit 51 is repeated during the time T2 if the write judging circuit 51 judges that the write is insufficient. The address of the memory cell that is within the memory cell array 41 and is detected as having the charge loss and the address of the write verify reference cell 17 within the reference memory cell array 44 are input from the control circuit 52 to the decoders 42 and 43 via the internal address generating circuit 54. In addition, the data that is written to the memory cell that is detected as having the charge loss and the write verify reference cell 17 may be re-input to the memory cell array 41 via the program data buffer 53 from outside the nonvolatile semiconductor memory device 31 or, input to the memory cell array 41 via the program data buffer 53 under the control of the control circuit 52 or, the output data of the normal sense amplifier 47 may be input to the memory cell array 41 via the program data buffer 53 under the control of the control circuit 52. The write verify after the additional write is carried out by inputting the same address as that of the additional write in a manner similar to that described above, so as to select the corresponding memory cell within the memory cell array 41 and the write verify reference cell 17 within the reference memory cell array 44, and comparing the data of the corresponding memory cell and the write verify reference cell 17 in the sense amplifier 49 and judging the compared result in the write judging circuit 51. The sense amplifier 49 that is used for the write verify may be the sense amplifier exclusively for the write verify as shown in FIG. 7 or, the normal sense amplifier 47 that is used during the read may be used in common as the sense amplifier 49. In the latter case, the output of the normal sense amplifier 47 is also supplied to the write judging circuit 51.

According to this embodiment, it is possible to detect the tendency of the charge loss of the memory cell and restore the charge loss before the read error judgement is made, without having to stop the system operation, even in a state where the nonvolatile semiconductor memory device has been forwarded and is assembled into a system.

Second Embodiment

Next, a description will be given of a second embodiment of the present invention. A system block diagram showing an important part of this second embodiment may be the same as that shown in FIG. 7, and a description and illustration thereof will be omitted. In the first embodiment, the read is made simultaneously from a plurality of addresses, and for this reason, the number of both the normal sense amplifiers 47 for the read and the sense amplifiers 48 for the charge loss detection corresponds to the number of addresses from which the data are read simultaneously from the memory cell array 41. But in this second embodiment, the data are not read simultaneously from a plurality of addresses of the memory cell array 41, and thus, the number of both the normal sense amplifiers 47 for the read and the sense amplifiers 48 for the charge loss detection does not need to correspond to the number of addresses from which the data are read simultaneously from the memory cell array 41.

In this embodiment, the detection of the tendency of the charge loss of the memory cell and the restoration of the memory cell that is detected as having the charge loss tendency are carried out during a sector erase. During the sector erase, no particular process is conventionally carried out with respect to the memory cells other than the memory cells that are the erase targets of the sector erase, and for this reason, this embodiment carries out the following process during the sector erase. That is, during the sector erase, this embodiment makes a read to detect the tendency of the charge loss of the memory cell, and if the memory cell having the charge loss is detected, makes the additional write (that is, programming) with respect to the memory cell that is detected has having the charge loss so as to restore the charge loss of this memory cell. Of course, the sector erase is normally carried out with respect to the memory cells that are the erase targets of the sector erase. By inserting the charge loss detection and restoration sequence into the sector erase sequence, the user can efficiently carry out the charge loss restoration without having to be aware of such, and as a result, it is possible to realize a nonvolatile semiconductor memory device having a high data holding (or storage) characteristic that can stably maintain the stored data.

Figure 11:
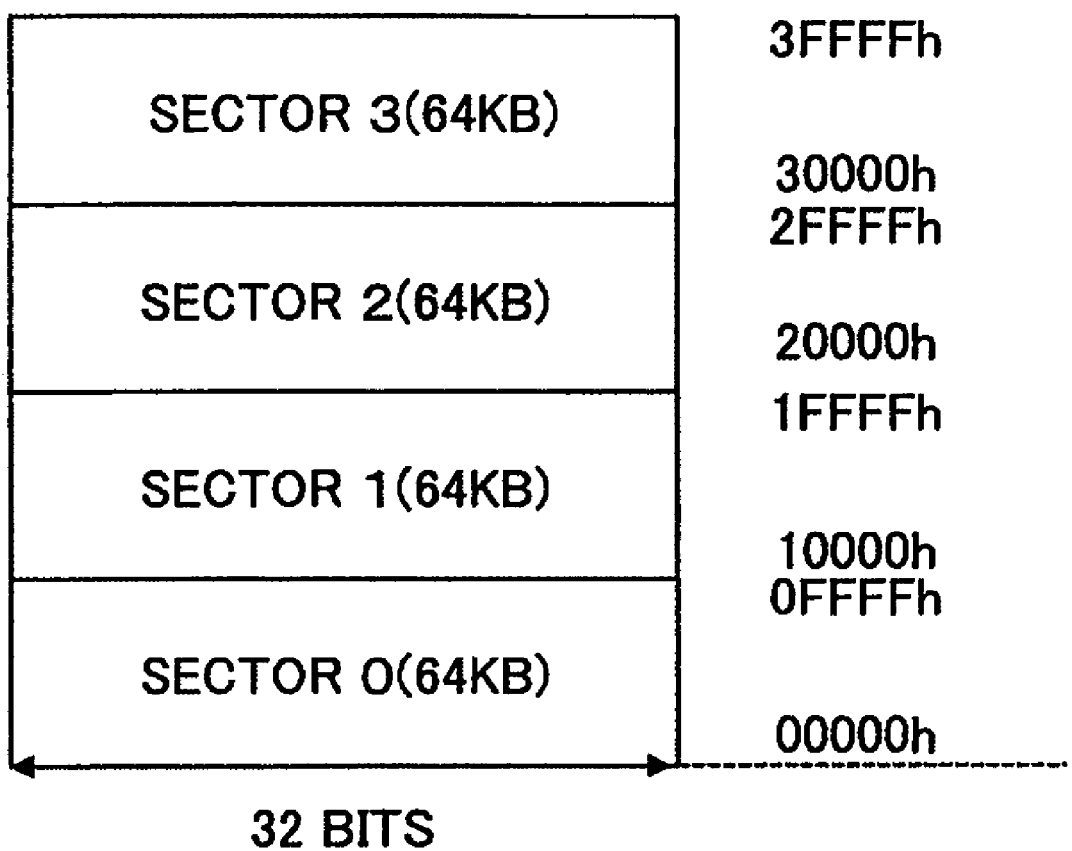
FIG. 11 is a diagram showing a sector structure of a nonvolatile semiconductor memory device.

A description will now be given of the sector erase, by referring to FIGS. 11 and 12. FIG. 11 is a diagram showing a sector structure of the nonvolatile semiconductor memory device 31, and FIG. 12 is a flow chart for explaining a general sector erase.

It is assumed for the sake of convenience that a memory space of the memory cell array 41 is segmented into a plurality of sectors as shown in FIG. 11, and the data erase is made in units of the sectors. FIG. 11 shows an example where the data width of one address is 32 bits, and the memory space is segmented into four sectors 0 through 3. When a sector erase command is issued and input to the control circuit 52, the control circuit 52 counts up an address counter 521 from an initial value "00000h" to a final value "3FFFFh" in a state where a sector number that is the erase target of the sector erase command is stored inside the control circuit 52. The address issued by the address counter 521 and the sector number stored inside the control circuit 52 are compared, and the sector erase is made if the regions indicated by these address and sector number match. The sector erase is made up of two stages, namely, a write (that is, programming) process and an erase process. The first stage once carries out the write (that is, programming) with respect to all of the memory cells of the sector that is the erase target so as to match the threshold values. When the write with respect to all of the memory cells that are erase targets is completed, the second stage carries out the erase of the memory cells. The erase verify of all of the memory cells that are the erase targets is carried out using the erase verify reference cell 15, and it is judged that the erase is completed when the address of the address counter 521 is counted up to the final value.

Figure 12:
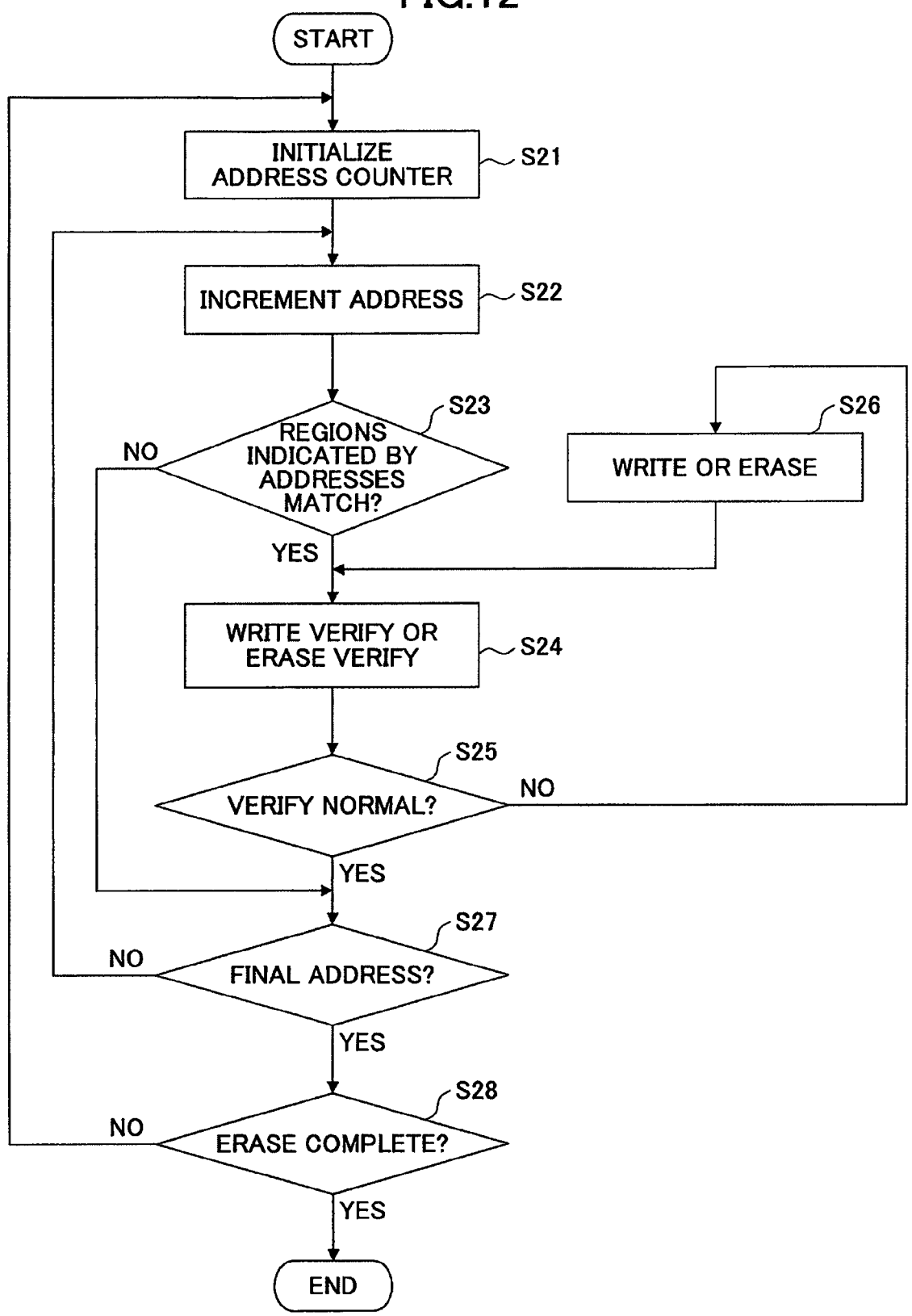
FIG. 12 is a flow chart for explaining a general sector erase.

In other words, when the sector erase is started, a step S21 shown in FIG. 12 initializes the address counter 521, and a step S22 increments the address of the address counter 521. A step S23 judges whether or not the regions indicated by the sector number that is the erase target of the sector erase command and the address of the address counter 521 match. If the judgement result in the step S23 is YES, a step S24 carries out the write verify or the erase verify. If the judgement result in the step S23 is NO, the process advances to a step S27 which will be described later. A step S25 judges whether or not the result of the write verify or the erase verify carried out in the step S24 is normal. If the judgement result in the step S25 is NO, a step S26 carries out the write (that is, programming) or the erase, and the process returns to the step S24. On the other hand, if the judgement result in the step S25 is YES, the step S27 judges whether or not the address of the address counter 521 is the final value. The process returns to the step S22 if the judgement result in the step S27 is NO. If the judgement result in the step S27 is YES, a step S28 judges whether or not the erase is completed. The process returns to the step S21 if the judgement result in the step S28 is NO, and the process ends if the judgement result in the step S28 is YES.

When making the sector erase, this embodiment carries out the charge loss detection and restoration with respect to the memory cells that are within the memory cell array 41 and are other than the erase targets of the sector erase.

In this embodiment, after the sector erase command is issued, the sector number that is the target of the sector erase and the address issued by the address counter 521 are compared, and if the regions indicated by these sector number and address match, the sector erase is carried out similarly as described above. However, if the regions indicated by these sector number and address do not match, the address counter 521 is not counted up immediately, and instead, the charge loss of the memory cell that is not the target of the sector erase is detected. The charge loss detection of the memory cell is similar to that carried out when making the normal read, but in addition to making the data judgement in the normal sense amplifier 47, the data judgment is also made in the sense amplifier 48 for the charge loss detection, and the existence of the charge loss is judged by the charge loss judging circuit 50 based on the output data of the two sense amplifiers 47 and 48. If a memory cell having the charge loss is detected as a result of the charge loss judgement made in the charge loss judging circuit 50, the additional write (that is, programming) is made with respect to the address of this memory cell so as to restore this memory cell. The data that is written by the additional write (that is, programming), may be the output data of the normal sense amplifier 47 that is output when making the charge loss detection. In this case, the output data of the normal sense amplifier 47 at the time of the charge loss detection is temporarily latched in the program data buffer 53 under the control of the control circuit 52 in response to a charge loss detection signal that is output from the charge loss judging circuit 50, and the temporarily latched output data becomes the additional write data when the charge loss is restored. After the additional write to restore the charge loss ends, the charge loss detection is carried out again, and the additional write and the write verify are repeated until no charge loss is detected.

Figure 13:
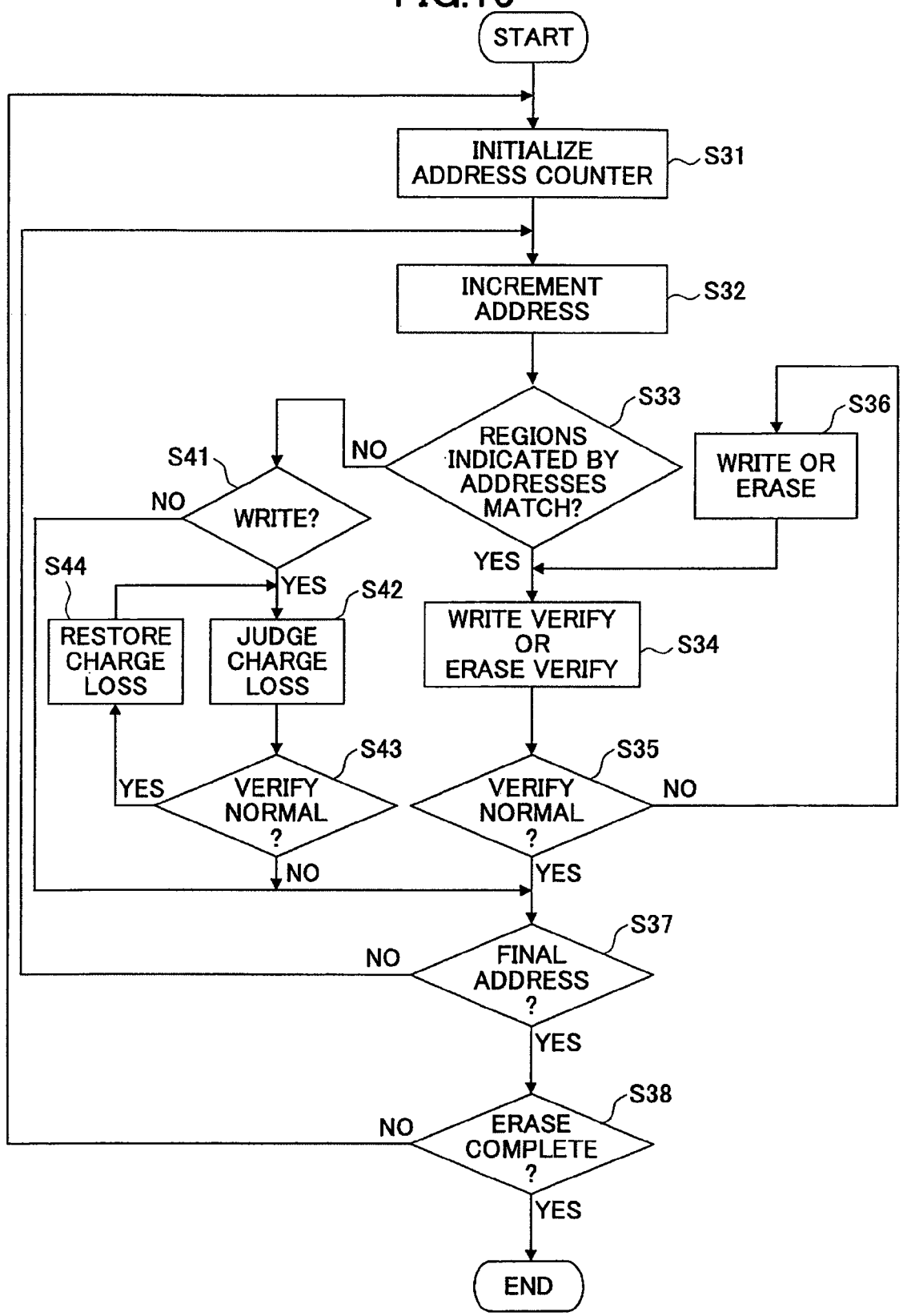
FIG. 13 is a flow chart for explaining a sector erase in a second embodiment of the present invention.

FIG. 13 is a flow chart for explaining a sector erase in this second embodiment of the present invention. When the sector erase is started, a step S31 shown in FIG. 13 initializes the address counter 521, and a step S32 increments the address of the address counter 521. A step S33 judges whether or not the regions indicated by the sector number that is the erase target of the sector erase command and the address of the address counter 521 match. If the judgement result in the step S33 is YES, a step S34 carries out the write verify or the erase verify. If the judgement result in the step S33 is NO, the process advances to a step S41 which will be described later. A step S35 judges whether or not the result of the write verify or the erase verify carried out in the step S34 is normal. If the judgement result in the step S35 is NO, a step S36 carries out the write (that is, programming) or the erase, and the process returns to the step S34. On the other hand, if the judgement result in the step S35 is YES, the step S37 judges whether or not the address of the address counter 521 is the final value. The process returns to the step S32 if the judgement result in the step S37 is NO. If the judgement result in the step S37 is YES, a step S38 judges whether or not the erase is completed. The process returns to the step S31 if the judgement result in the step S38 is NO, and the process ends if the judgement result in the step S38 is YES.

On the other hand, the step S41 judges whether or not the additional write (that is, programming) is to be carried out with respect to the memory cell that is other than the sector erase target. The process advances to the step S37 if the judgement result in the step S41 is NO. If the judgement result in the step S41 is YES, a step S42 judges the charge loss of the memory cell that is other than the sector erase target, using the charge loss detecting reference cell 13. A step S43 judges whether or not a memory cell having the charge loss is detected by the charge loss judgement of the step S42, and the process advances to the step S37 if the judgement result in the step S43 is NO. If the judgement result in the step S43 is YES, a step S44 restores the memory cell that is detected as having the charge loss by the charge loss judgement of the step S42, and the process returns to the step S42.

Figure 14:
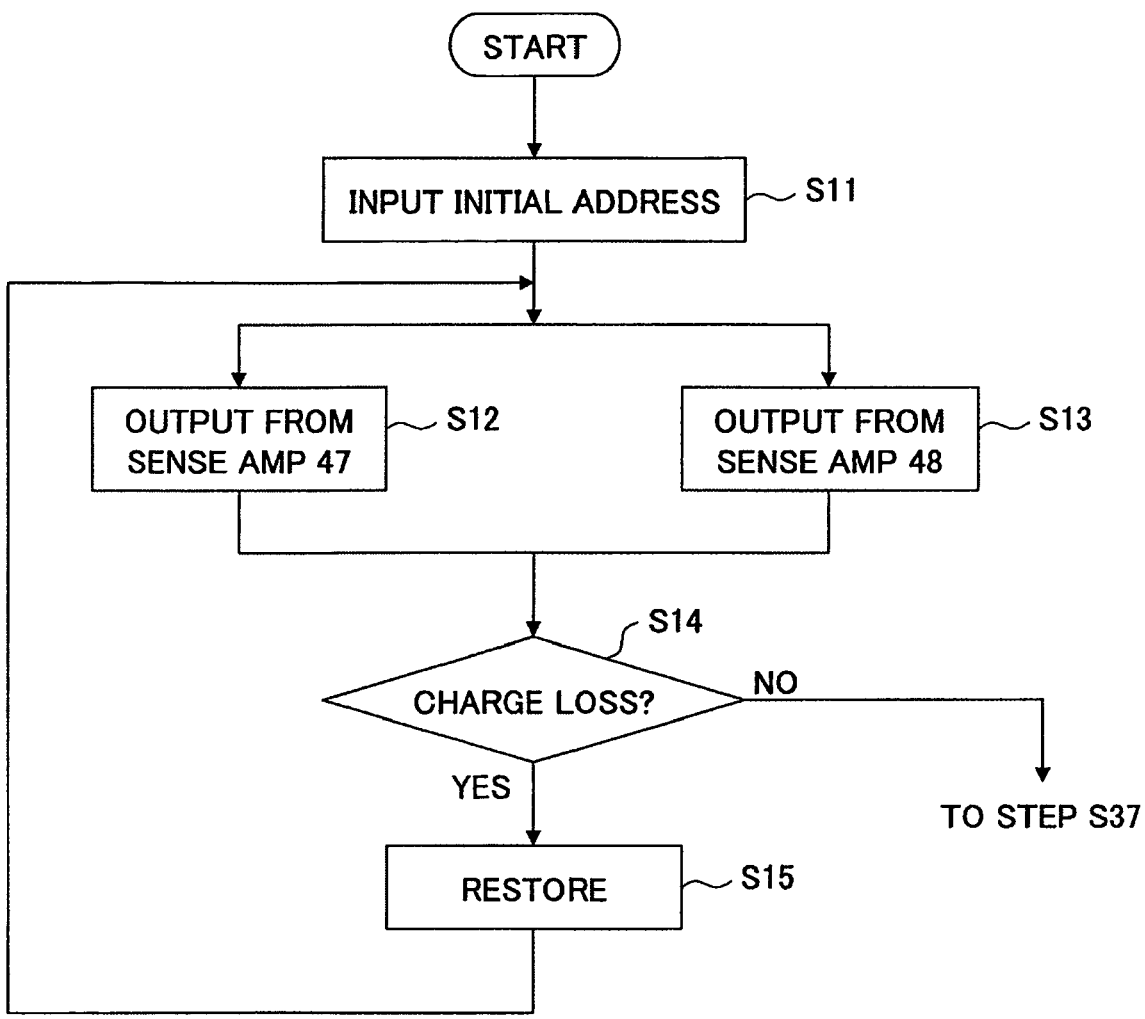
FIG. 14 is a flow chart for explaining a charge loss judging and restoration process of the second embodiment.

FIG. 14 is a flow chart for explaining a charge loss judging and restoration process of this second embodiment. The process shown in FIG. 14 corresponds to the process of the steps S42 through S44 shown in FIG. 13. In a step S11 shown in FIG. 14, the initial address is input to the decoders 42 and 43 via the internal address generating circuit 54. Steps S12 and S13 are carried out simultaneously. In the step S12, the output data having the data value judged by the normal sense amplifier 47 is output to the charge loss judging circuit 50. In the step S13, the output data the charge loss tendency of which is judged by the sense amplifier 48 is output to the charge loss judging circuit 50. In a step S14, the charge loss judging circuit 50 judges whether or not the charge loss is generated in the memory cell within the memory cell array 41 from which the read is made, for every data width of 32 bits. If the judgement result in the step S14 is YES, a step S15 makes the additional write with respect to the memory cell that is detected as having the charge loss and restores this memory cell, and the process returns to the steps S12 and S13 so as to judge the charge loss with respect to the same address again. In this case, the data that is written by the additional write may be the 32-bit output data of the normal sense amplifier 47 that is input to the memory cell array 41 via the program data buffer 53 or, a 32-bit data having a value "0" only for the bit in which the charge loss is detected and having a value "1" for the other bits, for example, that is input to the memory cell array 41 via the program data buffer 53 under the control of the control circuit 52. In addition, the data that is written by the additional write may be a 32-bit data that is input to the control circuit 52 from outside the nonvolatile semiconductor memory device 31 and input to the memory cell array 41 via the program data buffer 53. On the other hand, if the judgement result in the step S14 is NO, the process advances to the step S37 shown in FIG. 13.

According to this embodiment, it is possible to detect the tendency of the charge loss of the memory cell and restore the charge loss, without having to stop the system operation, even in a state where the nonvolatile semiconductor memory device has been forwarded and is assembled into a system. For this reason, it is possible to realize a nonvolatile semiconductor memory device having a high data holding (or storage) characteristic that can stably maintain the stored data. Moreover, it is possible to simplify the baking test or the like that is conventionally carried out for a long time in order to carry out the screening with respect to the memory cells that may have the charge loss.

This application claims the benefit of a Japanese Patent Application No. 2007-021478 filed Jan. 31, 2007, in the Japanese Patent Office, the disclosure of which is hereby incorporated by reference.

Further, the present invention is not limited to these embodiments, but various variations and modifications may be made without departing from the scope of the present invention.

What is claimed is:

1. A charge loss restoration method comprising:
a detection step detecting a memory cell having a tendency of a charge loss within a memory cell array of an electrically writable and erasable nonvolatile semiconductor memory device, using a charge loss detecting reference cell having a threshold value set between a threshold value of a read reference cell and a threshold value of a write verify reference cell, said threshold value of the write verify reference cell being higher than the threshold value of the read reference cell; and
a restoration step restoring the memory cell having the tendency of the charge loss by making an additional write thereto.

2. The charge loss restoration method as claimed in claim 1, wherein said detection step detects the memory cell having the tendency of the charge loss when simultaneously reading data from memory cells at a plurality of addresses.

3. The charge loss restoration method as claimed in claim 2, wherein said restoration step makes the additional write to the memory cell that is detected by said detection step as having the tendency of the charge loss, simultaneously as when the data read simultaneously are serially output from the memory cell array.

4. The charge loss restoration method as claimed in claim 3, wherein said restoration step makes the additional write to the memory cell that is detected as having the tendency of the charge loss, in a page mode or a burst mode of the nonvolatile semiconductor memory device.

5. The charge loss restoration method as claimed in claim 1, further comprising:
a verify step making a write verify using the write verify reference cell after making the additional write.

6. The charge loss restoration method as claimed in claim 1, wherein:
a memory space of the memory cell array is segmented into a plurality of sectors and a data erase is made in units of the sectors; and
said detection step and said restoration step are carried out with respect to a region other than an erase target of a sector erase when making the sector erase.

7. The charge loss restoration method as claimed in claim 1, wherein said detection step obtains a data value of the data read from the memory cell by comparing the data read from the memory cell and a data read from the read reference cell, obtaining a detection result by comparing the data read from the memory cell and a data read from the charge loss detecting reference cell, and detecting the tendency of the charge loss based on the data value and the detection result that are obtained.

8. The charge loss restoration method as claimed in claim 7, wherein said restoration step makes the additional write to the memory cell having the tendency of the charge loss by writing the data value that is obtained when said detection step detects the memory cell having the tendency of the charge loss.

9. The charge loss restoration method as claimed in claim 1, wherein said detection step and said restoration step are carried out in a state where the nonvolatile semiconductor memory device is forwarded and assembled into a system.

10. An electrically writable and erasable non-volatile semiconductor memory device comprising:
a memory cell array having a plurality of memory cells;
a charge loss detecting reference cell having a threshold value set between a threshold value of a read reference cell and a threshold value of a write verify reference cell, said threshold value of the write verify reference cell being higher than the threshold value of the read reference cell;
a detection circuit configured to detect a memory cell having a tendency of a charge loss within the memory cell array using the read reference cell and the charge loss detecting reference cell; and
a restoration circuit configured to restore the memory cell that is detected by said detection circuit as having the tendency of the charge loss, by making an additional write thereto.

11. The nonvolatile semiconductor memory device as claimed in claim 10, wherein said detection circuit detects the memory cell having the tendency of the charge loss when simultaneously reading data from memory cells at a plurality of addresses.

12. The nonvolatile semiconductor memory device as claimed in claim 11, wherein said restoration circuit makes the additional write to the memory cell that is detected by said detection circuit as having the tendency of the charge loss, simultaneously as when the data read simultaneously are serially output from the memory cell array.

13. The nonvolatile semiconductor memory device as claimed in claim 12, wherein said restoration circuit makes the additional write to the memory cell that is detected as having the tendency of the charge loss, in a page mode or a burst mode of the nonvolatile semiconductor memory device.

14. The nonvolatile semiconductor memory device as claimed in claim 10, further comprising:
a verify circuit configured to make a write verify using the write verify reference cell after making the additional write.

15. The nonvolatile semiconductor memory device as claimed in claim 10, wherein:
a memory space of the memory cell array is segmented into a plurality of sectors and a data erase is made in units of the sectors; and
said detection circuit and said restoration circuit carry out operations thereof with respect to a region other than an erase target of a sector erase when making the sector erase.

16. The nonvolatile semiconductor memory device as claimed in claim 10, wherein said detection circuit comprises:
a first sense amplifier configured to obtain a data value of the data read from the memory cell by comparing the data read from the memory cell and a data read from the read reference cell;
a second sense amplifier configured to obtain a detection result by comparing the data read from the memory cell and a data read from the charge loss detecting reference cell; and
a charge loss judging circuit configured to detect the tendency of the charge loss based on the data value and the detection result that are obtained.

17. The nonvolatile semiconductor memory device as claimed in claim 16, wherein said restoration circuit makes the additional write to the memory cell having the tendency of the charge loss by writing the data value that is obtained when said detection circuit detects the memory cell having the tendency of the charge loss.

* * * * *